(12) United States Patent
Islam

(10) Patent No.: US 7,154,770 B2
(45) Date of Patent: Dec. 26, 2006

(54) BITCELL HAVING A UNITY BETA RATIO

(75) Inventor: Rabiul Islam, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 124 days.

(21) Appl. No.: 10/949,766

(22) Filed: Sep. 25, 2004

(65) Prior Publication Data
US 2006/0067108 A1 Mar. 30, 2006

(51) Int. Cl.
G11C 11/40 (2006.01)
(52) U.S. Cl. .................. 365/154; 365/189.09
(58) Field of Classification Search ............... 365/154, 365/189.09
See application file for complete search history.

(56) References Cited

U.S. PATENT DOCUMENTS

| | | | | |
|---|---|---|---|---|
| 5,010,521 A | * | 4/1991 | Matsui | 365/189.01 |
| 5,070,482 A | * | 12/1991 | Miyaji | 365/230.06 |
| 5,379,260 A | * | 1/1995 | McClure | 365/201 |
| 5,600,589 A | * | 2/1997 | Ishigaki et al. | 365/154 |
| 5,724,292 A | * | 3/1998 | Wada | 365/207 |
| 5,771,190 A | * | 6/1998 | Okamura | 365/154 |
| 6,072,715 A | * | 6/2000 | Holloway | 365/156 |
| 6,515,893 B1 | * | 2/2003 | Bhavnagarwala | 365/154 |
| 6,556,471 B1 | | 4/2003 | Chappell et al. | 365/154 |
| 6,560,139 B1 | | 5/2003 | Ma et al. | 365/154 |
| 6,724,648 B1 | | 4/2004 | Khellah et al. | 365/154 |
| 2002/0186581 A1 | * | 12/2002 | Yamaoka et al. | 365/154 |

OTHER PUBLICATIONS

Fukaura, Y., K. Kasai, Y. Okayama, H. Kawasaki, K. Isobe, M. Kanda, Ishimaru, and J. Ishiuchi, *A Highly Manufacturable High Density embedded SRAM Technology for 90nm CMOS*. IEDM '02. Digest. International. 2002. pp. 415-418.

* cited by examiner

Primary Examiner—Tan T. Nguyen
(74) Attorney, Agent, or Firm—Trop, Pruner & Hu, P.C.

(57) ABSTRACT

In one embodiment, the present invention includes a memory device formed of a latch device that includes a pair of pull-up transistors and a pair of pull-down transistors to store data, and a pair of wordline transistors coupled between a wordline and the latch device. The pull-down transistors and the wordline transistors may be of substantially the same size and thus may have a unity beta ratio.

24 Claims, 4 Drawing Sheets

US 7,154,770 B2

BITCELL HAVING A UNITY BETA RATIO

BACKGROUND

High density embedded memory used for microprocessor caches and system on a chip (SOC) solutions for devices such as cellular telephones are becoming more prevalent. Further, memory cell size has been continually scaled down at each technology node to pack more bits for a given die size and cost. With reduced cell area, it is becoming increasingly difficult to maintain balance among stability, performance, and leakage current of the bitcell.

Embedded memory devices are often formed of static random access memory (SRAM) bitcells. Each bitcell (also referred to as a "cell") uses three transistor pairs, namely, access or wordline transistors, pull-down transistors, and pull-up transistors. The pull-up transistors may be implemented using p-channel metal oxide semiconductor (PMOS) transistors. The pull-down and access transistors may be implemented using n-channel MOS (NMOS) transistors. The bitcell may be implemented using a bistable flip-flop. The flip-flop includes the described pull-up and pull-down transistors, which may be accessed using the access transistors. A direct current (DC) supply voltage is applied to the flip-flop to retain data stored in it.

One problem associated with SRAM cells is leakage currents. These currents include a gate oxide leakage current and a sub-threshold leakage current. Individually, the leakage of one cell is relatively small. However, an SRAM array may include millions of cells. Thus, the leakage currents of multiple cells can result in substantial leakage for the array. This leakage is compounded with each new generation of SRAMs, as the smaller physical size of the cells enables more cells to be placed in an array. One solution to leakage currents is use of smaller voltages.

However, degraded memory performance can occur when reduced supply and bitline voltages are used to access and write data to the bitcell. Such lower voltages are susceptible to noise and other problems, and may lead to slower read times and/or inaccurate data, such as toggling of the data in the bitcell.

Still further, SRAMs can suffer from stability problems. Such stability problems include possible toggling of data in a bitcell, as a node between a pull-up and a pull-down device can vary from its target potential of a logic low value or a logic high value. As the potential of the node varies, stability is reduced and the state of the flip-flop forming the bitcell can be toggled. Accordingly, the transistor pairs are sized differently to optimize performance and stability. For example, the beta (defined as the width over length of a transistor) of the pull-down transistor is traditionally larger than that of the wordline transistor. In other words, a beta ratio (beta$_{pull-down}$/beta$_{wordline}$) between the devices is traditionally maintained at a value greater than 1 to guarantee stability. The requirement to size each of the SRAM transistor pairs differently further creates scaling challenges. As a result, SRAM memory design is typically a compromise between performance, stability, and size issues. A need thus exists for improved memory technology.

DETAILED DESCRIPTION

In various embodiments, all transistors of a bitcell may be formed with devices of the same size. Further, in some embodiments the transistors may be implemented with the smallest dimensions that a given technology node allows. In such manner, the cell is scalable and may offer significant savings in bit and die area. Such a cell with similarly sized pull-down and wordline transistors has a beta ratio of one (i.e., a unity beta ratio).

However, while such a bitcell may reduce complexity and die area it is likely to have read stability problems. Therefore, a unity beta ratio cell architecture in accordance with an embodiment of the present invention may be implemented with a biasing scheme that maintains the relative strengths of the wordline and the pull-down transistors through external circuit stimuli. Many different mechanisms may be used to generate the bias potentials. In one embodiment, biasing may be accomplished by driving the wordline device with a lower potential than the supply voltage provided to the source of the corresponding pull-up device. The reduced gate drive of the wordline device weakens the wordline device compared to the pull-down device and thus leads to enhanced cell stability.

Figure 1:
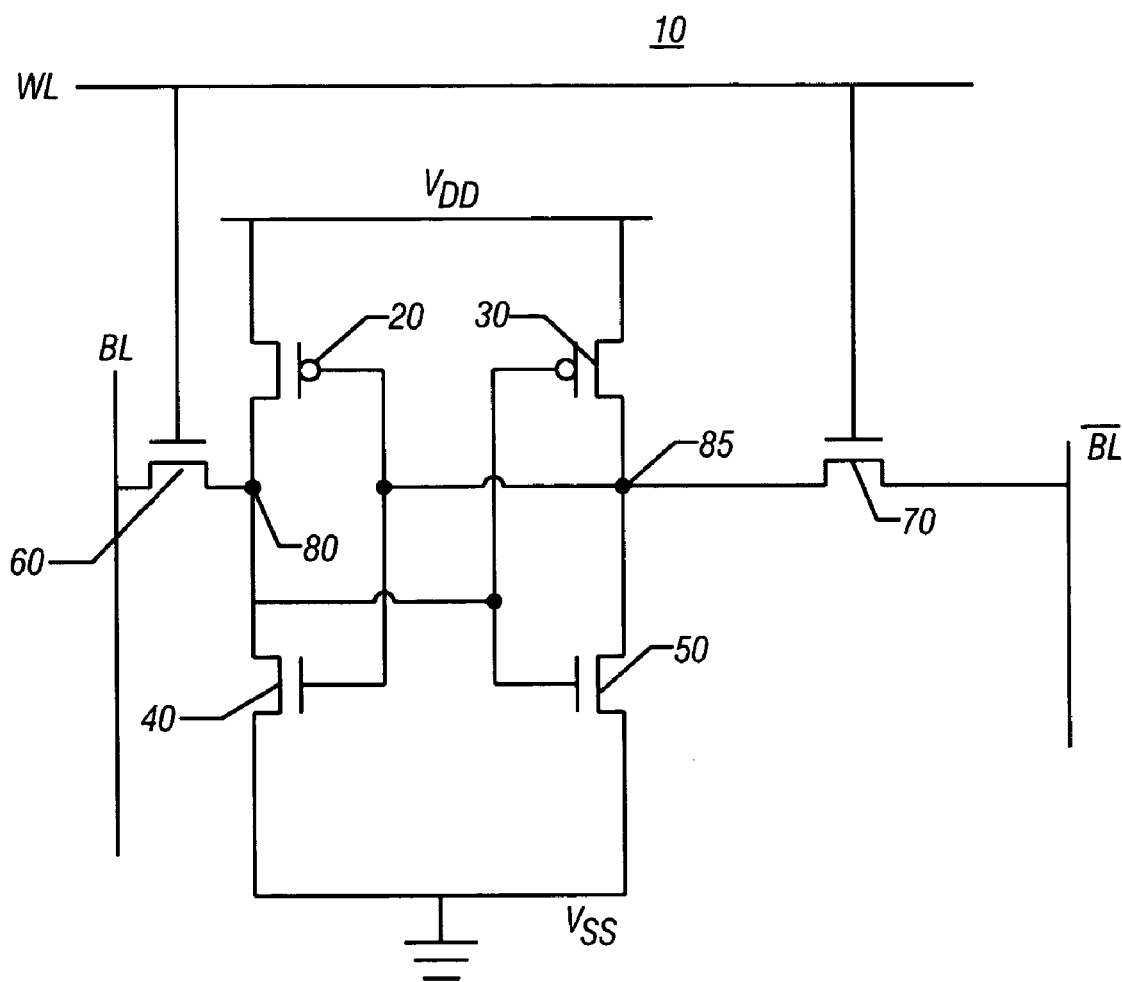
FIG. 1 is a block diagram of a bitcell in accordance with one embodiment of the present invention.

Referring to FIG. 1, shown is a block diagram of a bitcell in accordance with one embodiment of the present invention. As shown in FIG. 1, bitcell 10 may include a latch or flip-flop device formed of cross-coupled inverters. Specifically, a first inverter is formed with a pull-up device 20 and a pull-down device 40. In the embodiment of FIG. 1, pull-up device 20 may be a P-type MOS (PMOS) transistor and pull-down device 40 may be a N-type (NMOS) transistor. As shown in FIG. 1, pull-up device 20 and pull-down device 40 may be coupled together at a node 80, and further devices 20 and 40 may have gates coupled together.

As further shown in FIG. 1, a second inverter may be formed of a pull-up device 30 and a pull-down device 50. Specifically, pull-up device 30 may be a PMOS transistor and pull-down device 50 may be an NMOS transistor. As shown in FIG. 1, devices 30 and 50 have gates coupled together and are further coupled together at a node 85. Pull-up devices 20 and 30 have sources coupled to a supply voltage, $V_{DD}$, while pull-down devices 40 and 50 have drains coupled to a reference potential, $V_{SS}$, which may be a ground potential. The supply voltage $V_{DD}$ may be applied to the sources of pull-up devices 20 and 30 to retain desired voltages at nodes 80 and 85.

Also shown in FIG. 1, node 85 is coupled to the gates of pull-up device 20 and pull-down device 40 and node 80 is coupled to the gates of pull-up device 30 and pull-down device 50.

Information is stored in bitcell 10 in the form of voltage levels within the latch device. Specifically, when node 80 is at a logic low level, pull-up device 30 is on and pull-down device 50 is off. When pull-up device 30 is on and pull-down device 50 is off, node 85 is at a logic high level. When node 85 is at a logic high level, pull-up device 20 is off and pull-down device 40 is on. Thus, node 80 is at a logic low level.

As further shown in FIG. 1, node 80 is coupled to a bitline (BL) via a source of an access transistor 60, which may be an NMOS device. Access device 60 may have a gate coupled to a wordline (WL). Similarly, node 85 may be coupled to another bitline, namely bitline "not" ($\overline{BL}$) via a source of access transistor 70. In turn, access transistor 70 also has a gate coupled to WL.

In operation, to access bitcell 10 a high voltage on wordline WL turns on access transistors 60 and 70 to connect nodes 80 and 85 to bitlines BL and $\overline{BL}$, respectively. When bitcell 10 is enabled by access transistors 60 and 70, desired operations may occur, such as reading or writing data. Specifically, a read operation may occur by precharging bitlines BL and $\overline{BL}$ to the same potential, and then turning on access devices 60 and 70. When in this state, the potential of the one of the nodes 80 and 85 at a lower voltage may pull the corresponding bitline to a lower potential. This lower potential may be compared to the steadier voltage of the other bitline. Specifically, a sense amplifier (not shown in FIG. 1) coupled to the bitlines may be used to receive the voltages on the two bitlines, and determine which bitline is pulled low, indicating the value stored in bitcell 10. For a write operation, when access devices 60 and 70 are turned on, a desired value may be written to bitcell 10 via appropriate voltages applied to bitlines BL and $\overline{BL}$.

In various embodiments, all of the transistors associated with a bitcell may be of the same size. That is, in the embodiment of FIG. 1 pull-up devices 20 and 30, pull-down devices 40 and 50, and access devices 60 and 70 may all have the same beta. In such manner, the devices that form the bitcell may take advantage of process advances of present and future technology nodes and be scaled down uniformly. In certain embodiments, each of the transistors associated with a bitcell may be formed with the smallest transistor size for a given technology node. While discussed herein as having all transistors associated with a bitcell being of the same size, in other embodiments, the transistors may be of substantially the same size, as process and other variations may cause certain of the transistors to be a slightly different size than the other transistors. Furthermore, in certain embodiments while pull-down and wordline transistors may be sized substantially the same, the pull-up transistors may be sized differently.

By sizing the transistors associated with a bitcell similarly, stability of the bitcell may be affected. That is, stability of a cell is typically provided by sizing pull-down devices differently than wordline devices. In such manner, the voltage present at a node therebetween (e.g., nodes 80 or 85 of FIG. 1) may be at a voltage in accordance with a resistor divider between the pull-down device and the wordline device. For example, node 80 of FIG. 1 may be at a voltage generally equal to the resistance of pull-down device 40 divided by the combined resistance of pull-down device 40 and wordline device 60. In general terms, a voltage at a node (N) between a pull-down device and a wordline device may be represented by the following equation:

$$V_N = \frac{R_{pull-down}}{R_{pull-down} + R_{wordline}}. \quad [1]$$

Thus as a pull-down device becomes larger (i.e., stronger), its resistance is lowered. Accordingly, during read operations a suitable voltage exists at a node between a wordline transistor and a pull-down transistor such that it is unlikely that the value of an inverter formed between pull-down and pull-up transistors are flipped. In contrast, as a pull-down device becomes weaker, a read operation is more likely to encounter a voltage that causes a flipping of the inverter formed by the pull-up and pull-down devices.

Accordingly, in certain embodiments, different potentials may be used to drive the wordline associated with the bitcell and the supply voltage provided to the sources of the pull-up devices. This differential between a wordline potential and a supply potential may provide desired stability to the bitcell. At the same time, good read performance is maintained. Accordingly, embodiments may realize real estate improvements by sizing all of the transistors similarly, and particularly in embodiments where such transistors are sized at smallest dimensions of a given technology node. In such manner, the size of devices forming the bitcells themselves are not relied on for stability. Instead, external stimuli may be used to provide stability to a bitcell having devices of a substantially similar size.

In various embodiments, the voltage differential between a supply voltage and a wordline voltage may be between approximately 100 millivolts (mv) and 500 mv, although the scope of the present invention is not so limited. In one particular embodiment, a differential of approximately 100 millivolts may be present to provide for improved stability while maintaining desired read performance. For example, in one embodiment a supply voltage of 1.2 volts may be provided to the sources of the pull-up devices, while a wordline voltage of approximately 1.1 volts may be used to drive the gates of the access transistors. Thus in various embodiments, underdriving of a wordline voltage with respect to a supply voltage feeding a bitcell may provide desired stability for a bitcell formed of devices of substantially the same size.

Figure 2:
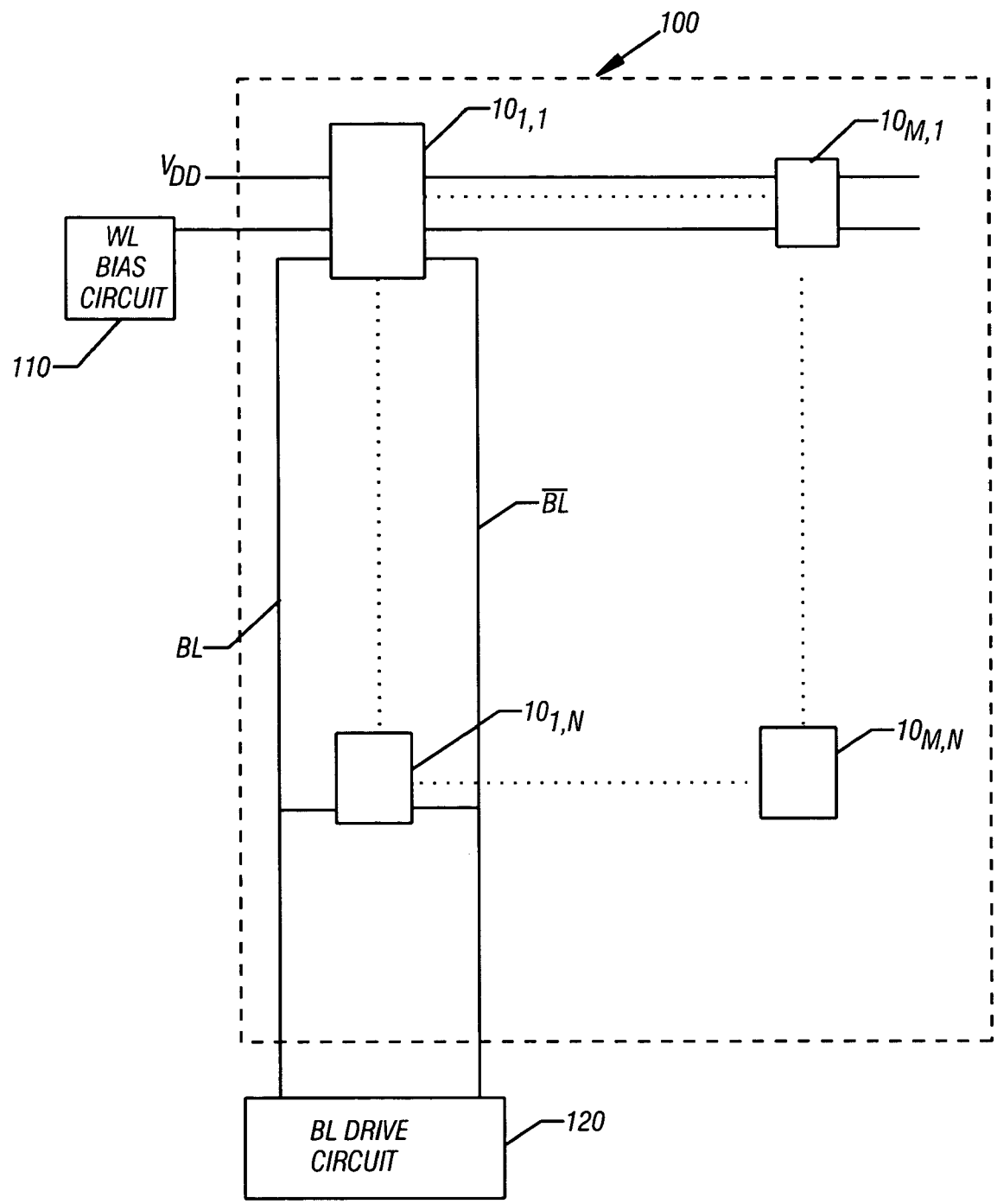
FIG. 2 is a block diagram of a static random access memory (SRAM) array in accordance with one embodiment of the present invention.

Referring now to FIG. 2, shown is a block diagram of an SRAM memory array in accordance with one embodiment of the present invention. As shown in FIG. 2, memory array 100 may be formed of a plurality of bitcells $10_{1,1}$ through $10_{M,N}$ (generically, bitcells 10). Bitcells 10 may be arranged in rows and columns to form memory array 100. As shown in FIG. 2, each bitcell 10 may be coupled to a wordline WL and a pair of bitlines BL and $\overline{BL}$. Furthermore, each bitcell 10 may be also coupled to receive a supply voltage $V_{DD}$. While not shown for ease of illustration in FIG. 2, each bitcell 10 may also be coupled to a reference voltage $V_{SS}$. Each row of memory array 100 may be coupled to receive an associated wordline potential from a wordline (WL) bias circuit 110. While bias circuit 110 may vary in different embodiments, such a bias circuit may be coupled to receive a voltage, such as a regulated voltage from a power supply and to provide a corresponding wordline voltage when a desired row is to be accessed. Bias circuit 110 may provide a voltage at a differential from supply voltage $V_{DD}$. For example, in one embodiment, a power supply may provide a regulated 1.2 volt supply voltage as $V_{DD}$ to each row of memory array 100. In contrast, bias circuit 110 may provide a lower potential to a wordline to be accessed. As discussed above, the differential may be between approximately 100 and 500 millivolts, in certain embodiments.

Further shown in FIG. 2 is a bitline (BL) drive circuit 120 that may be used to provide desired signals on bitlines BL and $\overline{BL}$. For example, when a desired row is to be accessed for a read operation, a pre-charge circuit within drive circuit 120 may provide a pre-charge voltage to bitlines BL and $\overline{BL}$ to pre-charge them to a desired potential which, in one embodiment may be equal to $V_{DD}$. Similarly, a write circuit within drive circuit 120 may provide a desired voltage on one of bitlines BL and $\overline{BL}$ to store a desired value into a selected bitcell 10. Furthermore, drive circuit 120 may include sense amplifiers used to sense voltages on bitlines BL and $\overline{BL}$ during read operations.

During a write operation, bitlines BL and $\overline{BL}$ may be pre-charged with the pre-charge circuit of drive circuit 120. Then, a write driver within drive circuit 120 grounds one of bitlines BL or $\overline{BL}$. At the same time, the wordline WL connected to the addressed bitcell 10 is driven to the reduced high potential to connect bitlines BL and $\overline{BL}$ to cell 10. The voltages on bitlines BL and $\overline{BL}$ thus toggle cell 10 to the desired state, which is stored within cell 10.

While not shown in FIG. 2, it is to be understood that one or more decoder circuits may be present to decode an incoming address to select a desired row and column of memory array 100. For example, a decoder circuit may receive an address and provide signals to bias circuit 110 and drive circuit 120 to access, for example, bitcell $10_{1,1}$. Further while not shown in FIG. 2, it is to be understood that a plurality of bias circuits 110 may be present, each coupled to a single wordline. While drive circuit 120 is shown coupled to a single pair of bitlines, in other embodiments drive circuit 120 may be shared among a number of bitline pairs, for example, to reduce area and power consumption. Furthermore, multiple drive circuits 120 may be present to couple to a single bitline pair or a group of such bitline pairs.

When wordline bias circuit 110, for example, is selected by the decoder it may provide a potential to the wordline to which it is coupled, selecting that wordline for an operation. Similarly, the decoder circuit may provide an enable signal to BL drive circuit 120 to enable the bitline pairs BL and $\overline{BL}$ coupled thereto. In such manner, a bitcell 10 present at the intersection between an activated wordline WL and activated bitlines BL and $\overline{BL}$ may be selected.

Figure 3:
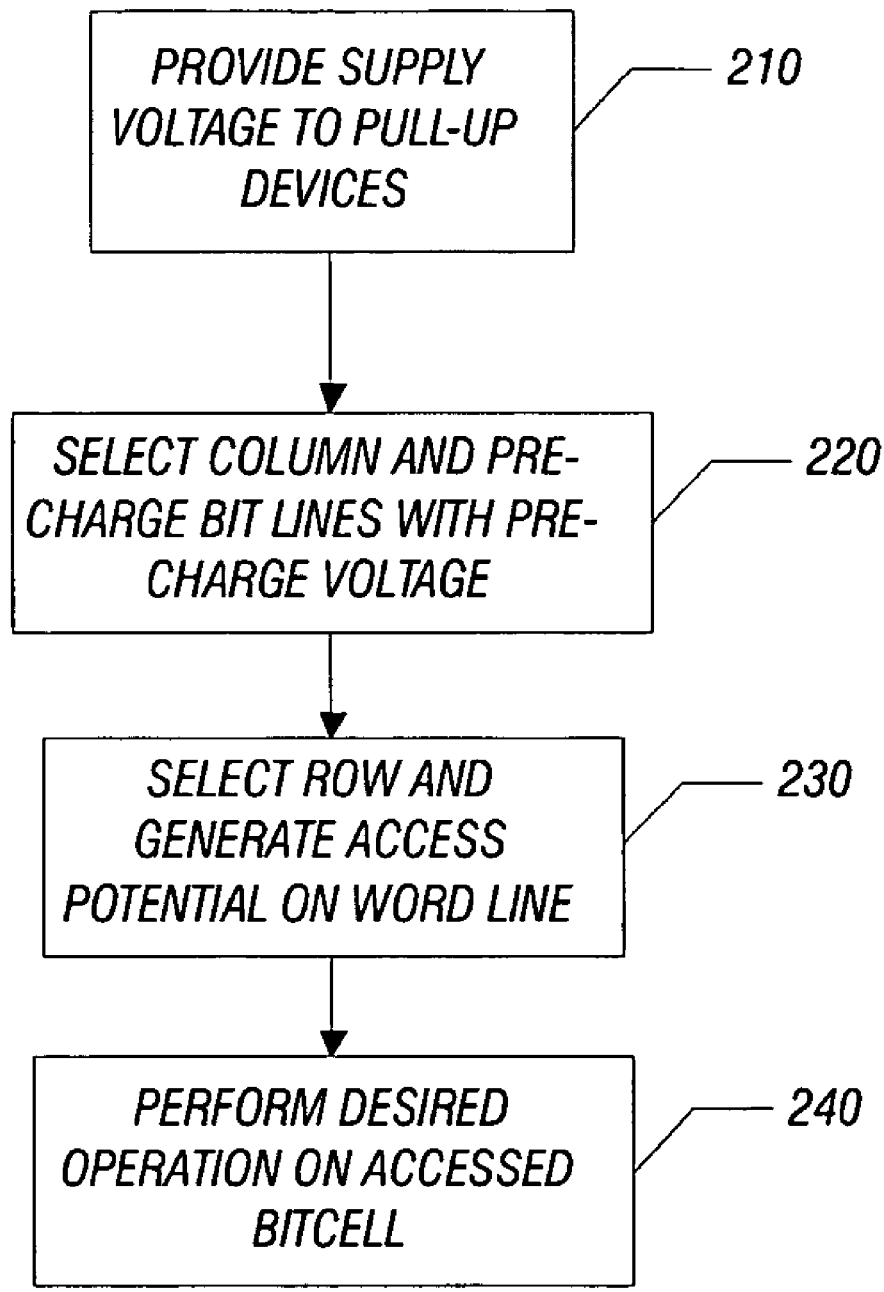
FIG. 3 is a flow diagram of a method in accordance with one embodiment of the present invention.

Referring now to FIG. 3, shown is a flow diagram of a method in accordance with one embodiment of the present invention. As shown in FIG. 3, method 200 may be used to access a desired bitcell of a SRAM memory array and perform a desired operation thereon. First, a supply voltage may be provided to pull-up devices of the bitcell (block 210). For example, a voltage supply coupled to a memory array may provide a regulated output voltage, for example, of 1.2 volts to sources of the pull-up devices.

Then a desired bitcell to be accessed may be selected based on an address received by the memory array. For example, such address may be provided by a processor to which the memory array is coupled. As an example, the memory array may be a cache memory residing on the same die as a processor, such as a central processing unit (CPU) of a system. Based on the received address, a column including the desired bitcell may be selected and bitlines coupled to the bitcell may be pre-charged with a pre-charge voltage (block 220). For example, such a pre-charge voltage may provide a high voltage potential, for example, at $V_{DD}$ to both bitlines BL and $\overline{BL}$ to pre-charge them to the same potential.

Similarly, a row including the accessed bitcell may be selected, for example, using a decoder circuit. Such a decoder circuit may be in common with a decoder circuit used for decoding the column, while in other embodiments separate row and column decoder circuits may be present. When the row is selected, an access potential may be generated on the wordline of the row (block 230). Such an access potential may be at a reduced high voltage potential, i.e., at a differential from the supply voltage. As discussed above, such differential may be between approximately 100 and 500 millivolts.

Thus at this time, the desired bitcell is fully accessed, and a desired operation may be performed on the accessed bitcell (block 240). For example, a read or write operation may be performed to read a value stored in the bitcell or write a desired value thereto.

Embodiments may be implemented in a program. As such, these embodiments may be stored on a storage medium having stored thereon instructions which can be used to program a system to perform the embodiments. The storage medium may include, but is not limited to, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs), erasable programmable read-only memories (EPROMs), electrically erasable programmable read-only memories (EEPROMs), flash memories, a phase change or ferroelectric memory, a silicon-oxide-nitride-oxide-silicon (SONOS) memory, magnetic or optical cards, or any type of media suitable for storing electronic instructions. Similarly, embodiments may be implemented as software modules executed by a programmable control device, such as a computer processor or a custom designed state machine.

Figure 4:
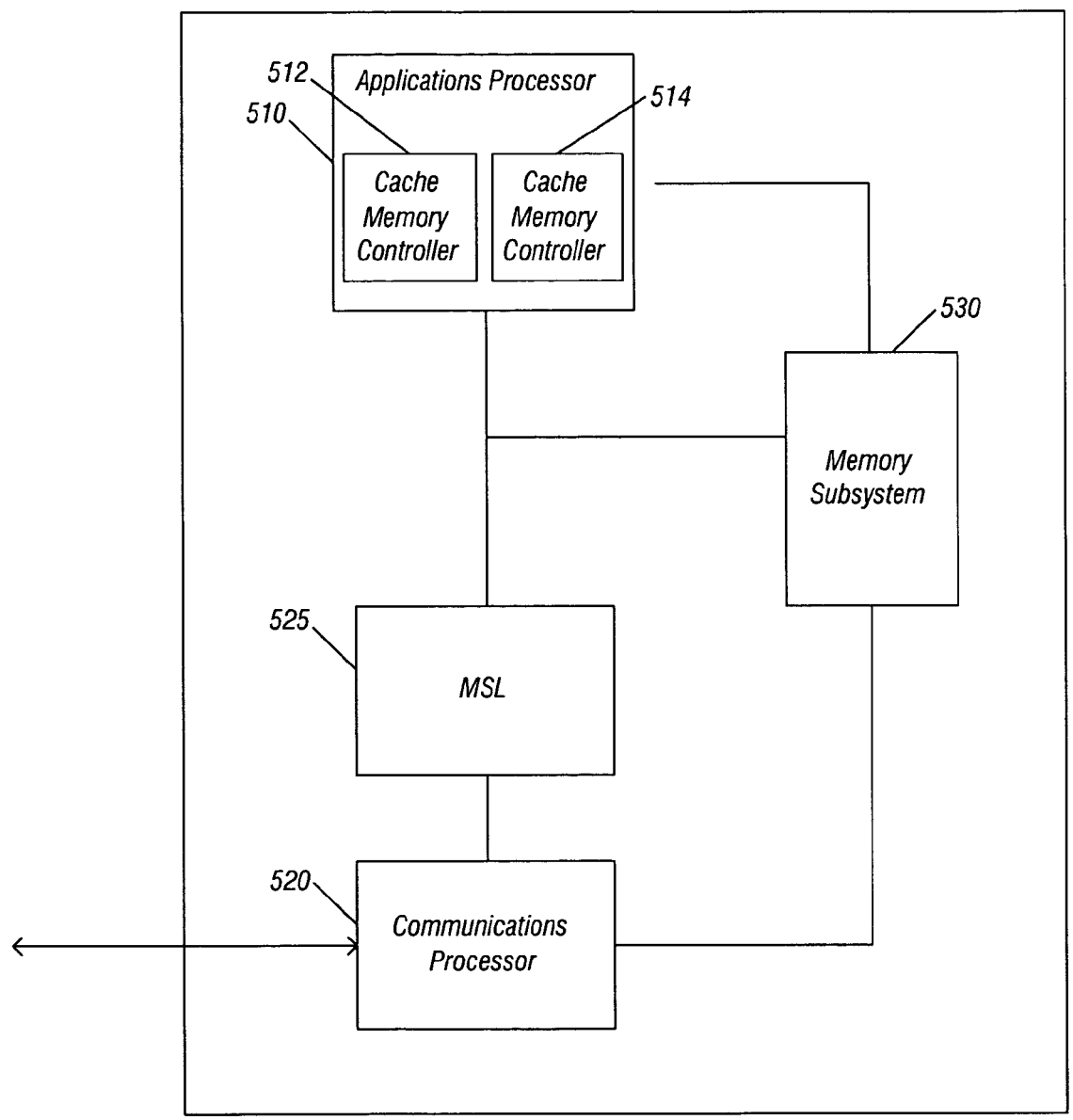
FIG. 4 is a block diagram of a wireless device with which embodiments of the present invention may be used.

Referring now to FIG. 4, shown is a block diagram of a wireless device with which embodiments of the invention may be used. As shown in FIG. 4, in one embodiment wireless device 500 includes an applications processor 510, which may include a general-purpose or special-purpose processor such as a microprocessor, microcontroller, application specific integrated circuit (ASIC), a programmable gate array (PGA), and the like. Applications processor 510 may be used to execute various applications such as data processing functions, modification and manipulation of digital content and the like. As shown in FIG. 4, applications processor 510 may include a cache memory controller 512 and a cache memory 514 in accordance with an embodiment of the present invention. Cache memory 514 may be formed of SRAM bitcells having a unity beta ratio in accordance with an embodiment of the present invention. In one embodiment, applications processor 510 may be a 32-bit processor, such as an XSCALE™ processor, available from Intel Corporation, Santa Clara, Calif.

Applications processor 510 may be coupled to a communications processor 520, which may be a digital signal processor (DSP) based on a micro signal architecture, via an internal bus, which may include a scalable link 525 (such as a mobile scalable link (MSL)), which may be formed of a plurality of gating devices to scalably transfer data between the processors. A memory subsystem 530 may be coupled to both applications processor 510 and communications processor 520, in certain embodiments. Memory subsystem 530 may include both volatile and non-volatile memory, such as static RAM (SRAM), dynamic RAM (DRAM), flash memories, and the like. While shown in FIG. 4 as separate components, it is to be understood that in other embodiments two or more of the components may be integrated into a single device, such as a single semiconductor device.

It is to be understood that communications processor 520 may include various functionalities including wireless communication with external sources. For example, communications processor 520 may include a wireless interface (which in turn may have an antenna which, in various embodiments, may be a dipole antenna, helical antenna, global system for wireless communication (GSM) or another such antenna). In certain embodiments, the wireless interface may support General Packet Radio Services (GPRS) or another data service. GPRS may be used by wireless devices such as cellular phones of a 2.5 generation (G) or later configuration. While shown in FIG. 4 as being a wireless device, it is to be understood that the scope of the present invention is not so limited. For example, a cache memory in accordance with an embodiment of the present invention may be located in a personal computer, server computer, notebook computer or other such system.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
    a latch device to store data, the latch device comprising a pair of pull-up transistors and a pair of pull-down transistors, the latch device to be driven with a supply voltage;
    a pair of wordline transistors coupled between a wordline and the latch device, wherein a beta of the pull-down transistors is substantially equal to a beta of the wordline transistors; and
    a bias circuit coupled to the wordline to drive the wordline transistors with a potential less than the supply voltage during a write operation.

2. The apparatus of claim 1, wherein the potential is at least approximately 0.1 volts lower than the supply voltage.

3. The apparatus of claim 1, wherein the potential is approximately between 0.1 and 0.5 volts lower than the supply voltage.

4. An apparatus comprising:
    a bias circuit to provide a first voltage to a wordline coupled to a plurality of access devices which are coupled to a storage cell comprising a first inverter cross-coupled to a second inverter, each inverter comprising a pull-up device and a pull-down device, wherein a beta ratio between the pull-down devices of the first and second inverters and the plurality of access devices is substantially equal; and
    a supply line to provide a supply voltage to the storage cell, the supply voltage greater than the first voltage during a write operation.

5. The apparatus of claim 4, further comprising a drive circuit to provide a pre-charge bitline voltage to a pair of bitlines coupled to the storage cell.

6. The apparatus of claim 5, wherein the pre-charge bitline voltage is substantially equal to the supply voltage.

7. The apparatus of claim 4, wherein the bias circuit is to be biased to maintain stability of the storage cell.

8. The apparatus of claim 4, wherein the storage cell is part of a static random access memory array.

9. The apparatus of claim 8, wherein the static random access memory array comprises a cache memory for a processor.

10. The apparatus of claim 4, wherein the supply voltage is at least approximately 0.1 volts greater than the first voltage.

11. The apparatus of claim 4, wherein the supply voltage is approximately between 0.1 and 0.5 volts greater than the first voltage.

12. A method comprising:
    providing a supply voltage to a bitcell formed of a latch device; and
    providing an access voltage to a pair of access devices coupled to the latch device to select the bitcell, wherein the access voltage is less than the supply voltage during a write operation, and wherein transistors that form the latch device and the pair of access devices are of a substantially equal size.

13. The method of claim 12, further comprising providing a pre-charge voltage to a pair of bitlines coupled to the bitcell.

14. The method of claim 12, further comprising underdriving the access voltage with respect to the supply voltage to maintain stability of the bitcell.

15. The method of claim 12, further comprising providing the access voltage at a level at least approximately 0.1 volts less than the supply voltage.

16. The method of claim 12, further comprising providing the access voltage at a level approximately between 0.1 to 0.5 volts less than the supply voltage.

17. A system comprising:
    a bias circuit to provide a first voltage to a wordline coupled to a plurality of access devices which are coupled to a storage cell including pall-up devices and pull-down devices, wherein a beta ratio between the pull-down devices and the plurality of access devices is substantially equal;
    a supply line to provide a supply voltage to the storage cell, the supply voltage greater than the first voltage during a write operation; and
    a wireless interface coupled to the bias circuit via an internal bus.

18. The system of claim 17, wherein the storage cell is part of a static random access memory array comprising a cache memory for a processor.

19. The system of claim 18, wherein the processor comprises an applications processor and the system comprises a wireless device.

20. The system of claim 17, wherein the supply voltage is at least approximately 0.1 volts greater than the first voltage.

21. The system of claim 17, wherein the supply voltage is by approximately between 0.1 and 0.5 volts greater than the first voltage.

22. An article comprising a machine-accessible storage medium containing instructions that if executed enable a system to:
    provide a supply voltage to a bitcell formed of a latch device; and
    provide an access voltage to a pair of access devices coupled to the latch device to select the bitcell, wherein the access voltage is less than the supply voltage during a write operation, and wherein transistors that form the latch device and the pair of access devices are of a substantially equal size.

23. The article of claim 22, further comprising instructions that if executed enable the system to provide a pre-charge voltage to a pair of bitlines coupled to the bitcell.

24. The article of claim 22, further comprising instructions that if executed enable the system to underdrive the access voltage with respect to the supply voltage to maintain stability of the bitcell.

* * * * *

UNITED STATES PATENT AND TRADEMARK OFFICE
CERTIFICATE OF CORRECTION

PATENT NO. : 7,154,770 B2
APPLICATION NO. : 10/949766
DATED : December 26, 2006
INVENTOR(S) : Rabiul Islam Page 1 of 1

It is certified that error appears in the above-identified patent and that said Letters Patent is hereby corrected as shown below:

Column 8:
Line 23, "pall-up" should be --pull-up--.

Signed and Sealed this

Sixth Day of March, 2007

JON W. DUDAS
*Director of the United States Patent and Trademark Office*